United States Patent [19]

Seki et al.

[11] Patent Number: 4,692,782
[45] Date of Patent: Sep. 8, 1987

[54] SEMICONDUCTOR RADIOACTIVE RAY DETECTOR

[75] Inventors: Yasukazu Seki, Tokyo; Noritada Sato; Masaya Yabe, both of Kanagawa, all of Japan

[73] Assignee: Fuji Electric Corporate Research & Development Co., Ltd., Japan

[21] Appl. No.: 613,890

[22] Filed: May 24, 1984

[30] Foreign Application Priority Data

Jun. 8, 1983 [JP] Japan ............................ 58-102381

[51] Int. Cl.$^4$ ..................... H01L 27/14; G01T 1/22
[52] U.S. Cl. ........................................ 357/29; 357/2; 357/30; 250/370
[58] Field of Search .............. 357/29, 2, 4, 30, 63, 357/59; 250/370.12, 370.14

[56] References Cited

U.S. PATENT DOCUMENTS

| | | | |
|---|---|---|---|
| 3,278,811 | 10/1966 | Mori | 357/29 |
| 3,668,480 | 6/1972 | Chang et al. | 357/20 |
| 4,214,253 | 7/1980 | Hall | 357/29 |

FOREIGN PATENT DOCUMENTS 0133930 4/1982 Japan ................................ 357/30

OTHER PUBLICATIONS

Behaviour of Amorphous Ge Contacts to Monocrystalline Silicon, H. Norde and P. A. Tove, Vacuum, vol. 27, No. 3, 201–208 (1977).
Correlation between Barrier Heights and Electron and Hole Currents from Schottky Contacts to Silicon Radiation Detectors and the Observation of Anomalously Low Hole Currents, P. A. Tove, Physica Scripta, vol. 18, 417 (1978).

Primary Examiner—James W. Davie
Assistant Examiner—Georgia Y. Epps
Attorney, Agent, or Firm—Brumbaugh, Graves, Donohue & Raymond

[57] ABSTRACT

In the representative radiation detectors described in the specification, an amorphous silicon layer is grown on one or both of the opposed electrode surfaces of a single crystal silicon substrate and the amorphous silicon layer extends to the side surface of the substrate. The corresponding electrode is deposited on the amorphous silicon layer. Detectors may also be made using a single crystal of Ge, GeAs or CdTe with an amorphous layer of the same or another semiconductor material.

4 Claims, 12 Drawing Figures

SEMICONDUCTOR RADIOACTIVE RAY DETECTOR

BACKGROUND OF THE INVENTION

The present invention relates to radiation detectors and, more particularly, to a new and improved radiation detector of the type which utilizes carriers generated by a radioactive ray in the depletion layer of a semiconductor.

The structure of semiconductor radioactive detectors of the prior art is shown in FIG. 1A and FIG. 1B, which illustrate surface barrier-type detectors, and in FIG. 1C, which illustrates a P-N junction-type detector. In semiconductor radioactive ray detectors a depletion layer is formed by applying a reverse bias to the surface barrier, or P-N junction, but if the resulting reverse leakage current is high, a low signal to noise ratio (S/N) is produced. Such reverse leakage current is classified into a surface leakage current, which flows along the surface of detector, and a volume leakage current, which flows entirely inside the detector. The amount of surface leakage current is determined by the surface condition of the single crystal semiconductor resulting from such factors as the method of manufacture, the nature of surface contamination, the free carriers in the protective surface film, and the carrier trap and interface levels. On the other hand, the volume leakage current consist of a component resulting from diffusion of carriers into the depletion layer and a component resulting from generation of carriers at the trapping centers in the depletion layer.

In a surface barrier-type detector such as shown in FIG. 1A, a protective oxide film 2 is formed at the surface of single crystal silicon plate 1 and a portion of the film 2 having strain due to processing is removed from the surface by chemical etching to provide a window leaving a very thin oxide film 3. A thin metal electrode film 4 is vacuum-deposited over the window and on the thin oxide film 3. However, the very thin oxide film 3 has an unstable composition $SiO_x$ which may change to stable $SiO_2$ when oxygen in the air migrates through the electrode metal thin film 4 and which also chemically combines at the surface of the single crystal silicon substrate 1, resulting in varations in the ageing characteristic of the detector.

Moreover, an inverted layer is generated at the surface of the silicon substrate 1 because the protective oxide film 2 contains ions and permits a surface leakage current to flow through the path 6 toward an electrode 5 in contact with the silicon substrate 1 at the side opposite to the electrode 3. In addition, charges are generated in the $SiO_2$ film during irradiation by radioactive rays. For example, continuous radiation of $10^5$ R or more causes an increase in surface leakage current. Further, when an N-type substrate is used as the silicon plate 1 and gold is vacuum-deposited as the electrode metal film 4, disadvantages such as weakness to mechanical impact and partial peeling result.

In a surface barrier-type detector such as shown in FIG. 1B, a thin silicon film 7 is coated onto a single crystal silicon substrate 1 by vacuum-deposition with a resistive heating system and, thereafter, an aluminum electrode 4 is formed on the film 7 by the vacuum-deposition method and either gold or aluminum is vacuum-deposited in the same way as an ohmic contact electrode on the opposite side. In this case, since a very thin oxide film is not used, there is no problem of variation in ageing characteristics resulting from stabilization of an unstable oxide but the problem of surface leakage current caused by the surface protection film remains. A detector showing such large reverse leakage current results in decrease in S/N when the diameter becomes large and therefore the detector of this type cannot be used with an area larger than about 1000 mm².

In the case of a P-N junction type detector, as shown in FIG. 1C, an impurity layer 8 is generally formed on the single crystal silicon substrate 1 by thermal diffusion or ion implantation and thermal processing for which a temperature of about 800° to 1200° C. is required. However, such high temperature thermal processing causes the volume leakage current to increase because crystal defects are produced or heavy metal ions enter the single crystal semiconductor substrate. Moreover, since oxygen contained in the silicon single crystal changes to a donor during such high temperature thermal processing, the specific resistance of single crystal semiconductor is sometimes lowered. However, when the thermal processing temperature is decreased in order to avoid deterioration of the single crystal material caused by high temperature thermal processing, the following disadvantages result:

(1) The variation in impurity concentration becomes extremely large or the formation of an impurity layer by diffusion becomes impossible.

(2) Introduction of crystal defects by impurity ion implantation is imperfect and, moreover, replacement of the implanted impurities in the lattice position is insufficient.

Accordingly, proper thermal processing at a temperature as low as 800° C. or lower is almost impossible. Therefore, semiconductor detectors are manufactured by conventional high temperature thermal processing which results in a high level of noise, interfering with the characteristics of the device. In this case, since an $SiO_2$ film 2 is also provided, the surface leakage current following the route 6, or resulting from high radiation levels, increases.

It is an object of the present invention to provide a semiconductor radioactive ray detector which eliminates the above-mentioned disadvantages, does not have variable ageing characteristics, is rigid, and assures good high energy radiation resolution.

SUMMARY OF THE INVENTION

In accordance with the invention, a semiconductor radioactive ray detector consists of a single crystal semiconductor having opposed electrode surfaces, which is coated on at least one electrode surface with an amorphous semiconductor layer having a high specific resistance and in which the amorphous semiconductor layer extends to the side surface of semiconductor substrate, an electrode being deposited on the amorphous semiconductor layer. The amorphous semiconductor layer may also be coated on the other electrode surface with the corresponding electrode deposited on the amorphous layer.

DESCRIPTION OF PREFERRED EMBODIMENTS

Figure 1A:
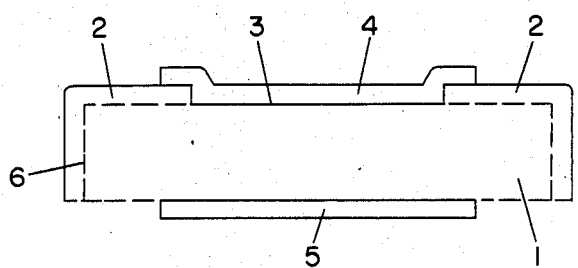
FIGS. 1A-1C are schematic sectional views illustrating three examples of conventional semiconductor detectors.
Figure 1B:
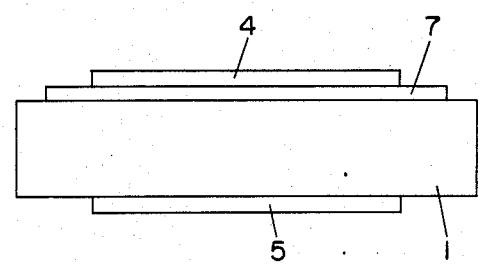
Figure 2A:
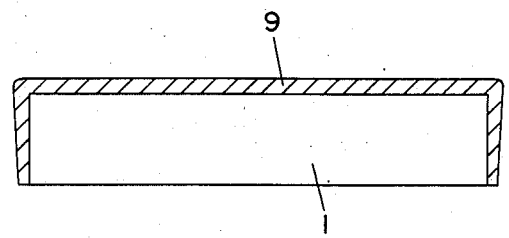
FIGS. 2A and 2B are schematic sectional views illustrating tages in the manufacture of one embodiment of the present invention.
Figure 1C:
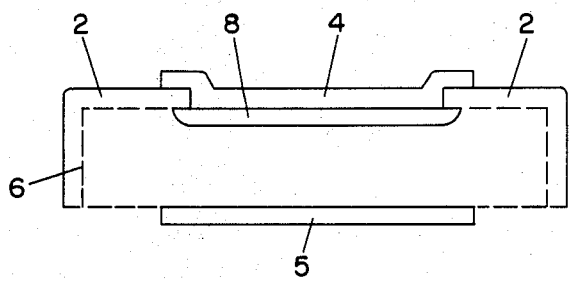
Figure 2B:
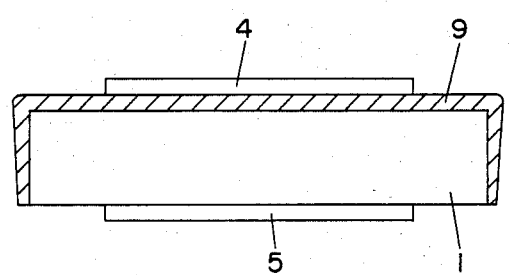

Two successive stages in the manufacture of one embodiment of a semiconductor radioactive ray detector according to the present invention are shown in FIG. 2A and FIG. 2B, respectively. First, a dopant-free amorphous silicon layer 9 having a high specific resistance and a thickness of about 1μm is caused to grow under the conditions described hereinafter on one electrode surface and the side surface of a single crystal silicon base material 1 having a specific resistance, for example, of 10k ohm-cm or higher. The portion of the layer in which strain has been developed by processing is removed by degreased washing and chemical etching. This amorphous silicon layer has a specific resistance, for example, of about $10^{10}$ ohm-cm, and such high specific resistance cannot be obtained in the case of vacuum-deposited silicon. The amorphous silicon growth technique itself is well known and need not be described herein, but the substrate temperature during growth is kept at a low temperature, such as about 100 to 300° C. Thereafter, as shown in FIG. 2B, an electrode 4 which consists, for example, of aluminum, and has a thickness of 0.1μm, and an ohmic contact electrode 5 which consists, for example, of gold and has a thickness of 0.005μm, are vacuum deposited, on an area of about 1000 $mm^2$ on the amorphous silicon layer 9 and on the silicon crystal, respectively.

The growing conditions for amorphous silicon layer 9 are as follows:

Single crystal silicon substrate: P type, specific resistance of 10K ohm-cm or higher, diameter of 40 mm, thickness of 350μm.
Reaction temperature: 200° C.
Reaction gas: Monosilane diluted to 10% by hydrogen
Pressure of the reaction gas: 10 torr
Voltage and current density during discharge: 700 V. DC, 0.1 mA/$cm^2$
Discharge time: 30 minutes
Distance between electrodes: 50 mm In the completed detector, the amorphous silicon layer 9 having a high specific resistance, which is interposed between the silicon substrate 1 and the metal electrode 4, intercepts the path of surface leakage current. Accordingly, an inverted layer is not generated at the substrate surface and consequently the surface leakage current is reduced. Moreover, the thermal expansion coefficient of the layer 9, closely matches that of the semiconductor crystal and, as a result, it is not subject to deterioration at high temperatures, high vacuum conditions and high levels of radiation. In addition, the layer 9 is suitable as a protective film to the extent that it is more resistive to radioactive rays than the $SiO_2$ film formed by thermal processing. In other words, when a reverse bias is applied across both electrodes 4 and 5, the depletion layer spreads from the junction area of the amorphous silicon layer 9 and crystal silicon substrate 1 with increase in applied voltage and, simultaneously, the amorphous silicon layer 9 is effective as a surface protection film at the periphery of the electrodes. Furthermore, because the amorphous silicon layer is grown at a lower temperature, the substrate 1 maintains its intrinsic crystal characteristic and does not permit increased volume leakage current.

Figure 3:
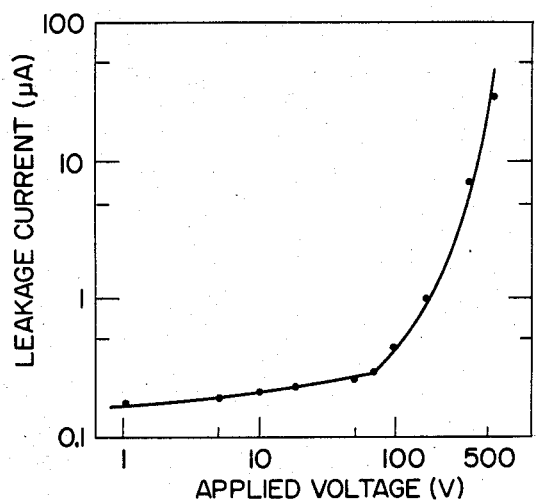
FIG. 3 is a graphical representation showing the reverse I-V characteristic diagram of a representative detector according to the present invention.

The characteristics obtained from such a detector are described below. FIG. 3 shows the reverse I-V characteristic. It is almost the same as the volume leakage current (at V=40V) obtained with a carrier life time of 1000μsec. From these results, the surface leakage current is shown to be very low even when the electrode area is 1000 $mm^2$. The values measured an hour and a year after formation of the electrodes 4 and 5 do not change, showing that there is no variation with age as is seen in conventional surface barrier-type detectors.

Figure 4:
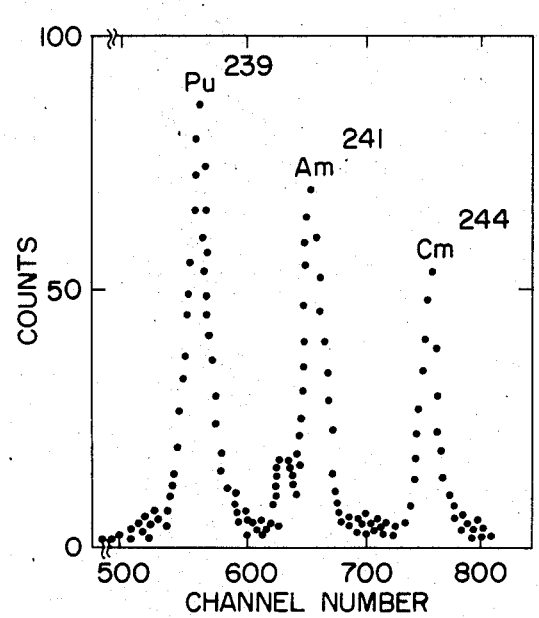
FIG. 4 is a graphical representation showing the spectrum of α-rays obtained by a typical detector according to the present invention.
Figure 5:
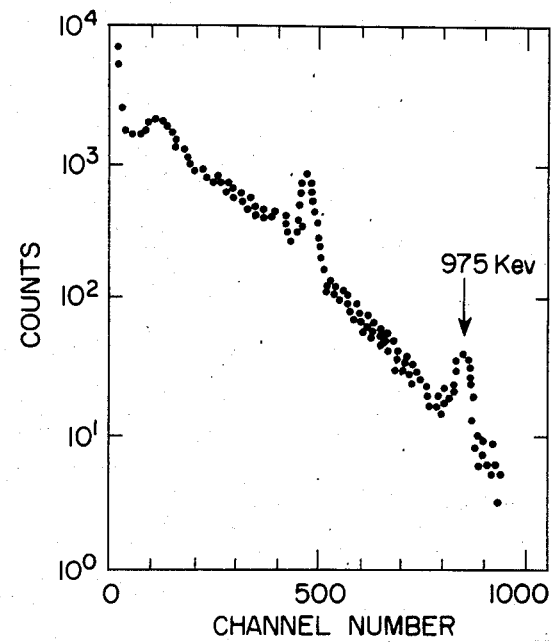
FIG. 5 is a graphical representation showing the spectrum of β-rays from $Bi^{207}$ obtained by a detector according to the invention.
Figure 6:
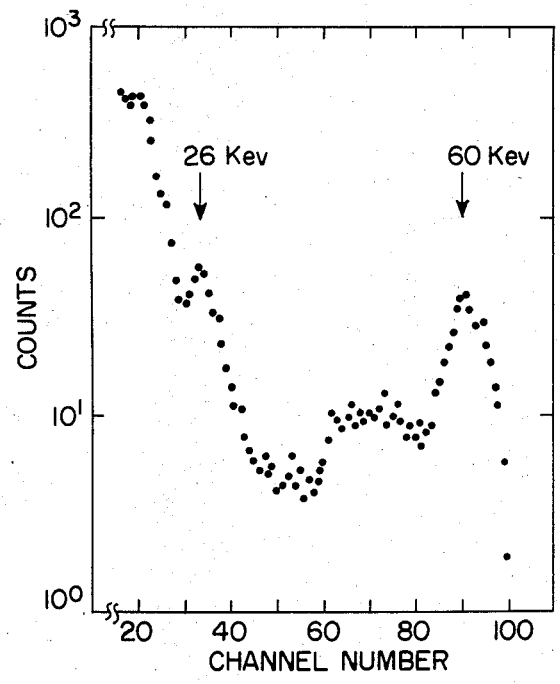
FIG. 6 is a graphical representation showing the spectrum of γ-rays from $Am^{241}$ obtained by a detector according to the invention.

FIG. 4 to FIG. 6 respectively show the radiation response spectra obtained by the detector in which the number of counts is shown for each of a series of channels in which rays are selected according to energy. FIG. 4 shows the response spectrum for α rays from $Pu^{239}$, $Am^{241}$ and $Cm^{244}$, while FIG. 5 shows the spectrum of β rays from $Bi^{207}$ and FIG. 6 shows the spectrum of γ rays from $Am^{241}$. These are equivalent to the detection characteristics of conventional surface barrier-type detectors.

Figure 7A:
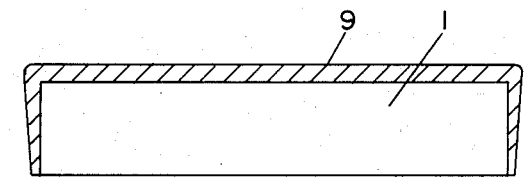
FIGS. 7A-7C are schematic sectional views illustrating stages in the manufacturing process of another embodiment of the present invention.
Figure 7B:
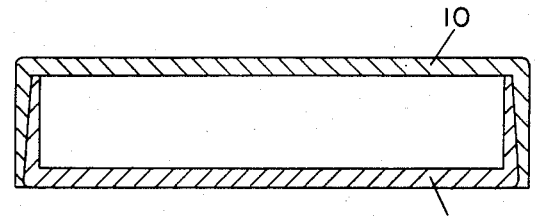
Figure 7C:
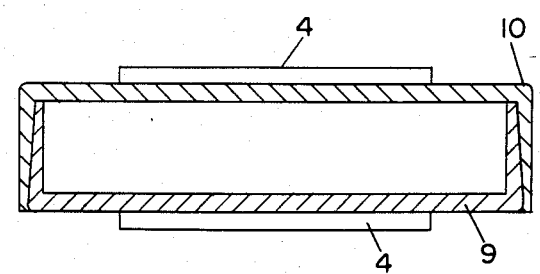

FIG. 7A-7C show another embodiment of the present invention. In this case, a dopant-free amorphous silicon film 9 is grown on one electrode surface and on the side surface of a single crystal silicon substrate 1 as shown in FIG. 7A and, thereafter, an amorphous silicon film 10 is grown on the other electrode surface and on the side surface of the substrate 1 as shown in FIG. 7B. Then, metal electrodes 4 consisting, for example, of aluminum, are formed on both electrode surfaces by conventional vacuum-deposition as shown in FIG. 7C. In this structure the depletion layer forms under the electrode to which a reverse bias is applied but no such depletion layer forms under the other electrode because a forward bias voltage is applied to it. Accordingly, this detector element can be used with voltage applied in either direction. This detector has the advantage, for example, that, even if there is a pinhole in one of the amorphous silicon layers 9 and 10, the surface leakage current does not increase when a reverse bias voltage is applied to the electrode on the other amorphous silicon layer.

In the embodiment of FIGS. 7A-7C, silicon of 10k ohm-cm or higher is used as the single crystal semiconductor substrate. In this way a detector can be made in which the depletion layer is extended as much as possible with application of a low reverse bias voltage so that the sensitivity to radioactive rays is increased. For detecting X-rays or γ-rays at dosage levels as high as 10 R or more, a narrow depletion layer is desirable. Under such high dosage conditions, a phenomenon occurs called the pile-up phenomenon, in which an individual X-ray or γ-ray cannot be isolated. This occurs because electrons and holes generated within the depletion layer by an X-ray or γ-ray may not reach the electrodes before the electrons and holes from the next X-ray or γ-ray are generated or else the electrical pulse produced by the second ray appears in the counter circuit before the pulse generated by preceding electron and hole pair has been counted, resulting in only a single count in the counter circuit. Therefore, it is desirable for the depletion layer to have a small volume in order to distinguish between continuously incident X-rays or γ-rays even under such high dosage conditions. For this purpose, a single crystal silicon substrate having a resitivity of 10k ohm-cm or lower, for example, several ohm-cm, may be used if the dosage is 100 R or lower. It will be understood that the same growth conditions as described above for the amorphous silicon layer can also be used in this case.

In the above example, an amorphous silicon layer is deposited on a single crystal silicon substrate. The invention is also effective, however, with single crystal substrates of Ge, GaAs and CdTe, for example, using amorphous Ge, GaAs, or CdTe as the amorphous semiconductor layer. Moreover, combinations of different substances, such as an amorphous silicon layer grown on a single crystal of Ge, are also effective. The growth conditions for amorphous Ge are substantially the same as those for an amorphous silicon layer as described above. The only difference is the use of gellumanium in place of monosilane. Preferably, a reaction gas reduced to 10% with hydrogen should be used.

Since Ge, GaAs and CdTe are higher in atomic number than silicon, these materials may be used to provide a detector having excellent detection efficiency for γ-rays.

According to the present invention, an amorphous semiconductor layer is deposited under a low temperature of about 100° to 300° C. on one electrode surface and the side surface, or on both electrode surfaces and the side surface of a single crystal semiconductor substrate and electrodes are then formed on the electrode surfaces. As a result, the present invention provides the following improvements and makes it possible to provide a highly reliable and rigid detector assuring excellent energy resolution in a simple and effective manner:

(1) All manufacturing procedures are carried out at a low temperature. Therefore, there is no change in the specific resistance of the crystal or deterioration of the life time of minority carriers and, accordingly, the volume leakage current is low.

(2) The surface leakage current component is almost completely eliminated since an amorphous semiconductor layer having a high specific resistance covers the entire electrode surface up to the side of the crystal.

(3) For detectors utilizing a silicon single crystal substrate, there is an amorphous semiconductor layer between the surface electrode metal and single crystal semiconductor substrate. Accordingly, oxygen in the air does not reach the single crystal substrate, unlike the conventional surface barrier-type detector. As a result, there is no variation in the ageing characteristic as in conventional surface barrier-type detectors.

(4) The provision of an amorphous semiconductor film as a surface protection film permits an increase in resistance to effects of high radiation dosages.

(5) A high manufacturing yield is obtained because of simple manufacturing processes requiring fewer man-hours.

(6) The amorphous semiconductor film is much thinner than the PN junction layer, and therefore it contains fewer insensitive regions and has greater sensitivity to charged particles such as γ-rays and β-rays.

We claim:

1. A semiconductor radiation detector comprising
   a single crystal semiconductor substrate having a specific resistance of at least 10 KΩ-cm, and having electrode surfaces separated by side surfaces,
   an undoped amorphous semiconductor layer having a specific resistance substantially higher than that of said substrate, said amorphous layer coating at least one of said electrode surfaces at least up to the side surfaces,
   a first electrode deposited on said amorphous layer, and
   a second electrode deposited over the other of said electrode surfaces.

2. A detector in accordance with claim 1 in which an amorphous semiconductor layer of specific resistance higher than that of said substrate, coats said other electrode surface and said second electrode is deposited over said last-mentioned amorphous layer.

3. A semiconductor in accordance with either claim 1 or claim 2 in which the substrate and each amorphous layer are of the same semiconductor material.

4. A semiconductor in accordance with claims 1 or 2 in which the substrate and each amorphous layer are of a different semiconductor material.

* * * * *

UNITED STATES PATENT AND TRADEMARK OFFICE
CERTIFICATE OF CORRECTION

PATENT NO. : 4,692,782
DATED : September 8, 1987
INVENTOR(S) : Seki et al.

It is certified that error appears in the above-identified patent and that said Letters Patent is hereby corrected as shown below:

First page, Item 73, before "Japan" insert --and Fuji Electric Company, Ltd., both of--;
Column 1, line 28, "consist" should read --consists--;
Column 1, line 45, "varations" should read --variations--;
Column 3, line 2, "tages" should read --stages--;
Column 5, line 11, "resitivity" should read --resistivity--;

Signed and Sealed this

Third Day of May, 1988

Attest:

DONALD J. QUIGG

Attesting Officer

Commissioner of Patents and Trademarks